US 10,701,840 B2

(12) United States Patent
Kamiya et al.

(10) Patent No.: US 10,701,840 B2
(45) Date of Patent: Jun. 30, 2020

(54) POWER CONVERTER FOR RAILROAD VEHICLE

(71) Applicant: FUJI ELECTRIC CO., LTD., Kawasaki-shi, Kanagawa (JP)

(72) Inventors: Akira Kamiya, Koganei (JP); Kimihisa Kaneko, Yokohama (JP); Yoshihisa Uehara, Suzuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/900,252

(22) Filed: Feb. 20, 2018

(65) Prior Publication Data

US 2018/0310431 A1    Oct. 25, 2018

(30) Foreign Application Priority Data

Apr. 24, 2017    (JP) .................. 2017-085138

(51) Int. Cl.
| H05K 7/20 | (2006.01) |
| B61C 3/00 | (2006.01) |
| B61C 17/00 | (2006.01) |
| B61D 27/00 | (2006.01) |

(52) U.S. Cl.
CPC .............. H05K 7/209 (2013.01); B61C 3/00 (2013.01); B61C 17/00 (2013.01); B61D 27/0072 (2013.01)

(58) Field of Classification Search
CPC .............. H05K 7/209; H05K 7/20145; H05K 7/20409–20418; H05K 7/20909–20918; B61C 3/00; B61C 17/00; B61D 27/0072; B60L 2200/26; H01L 23/3672; H01L 23/467
USPC .............. 361/709–711, 678, 679.46, 679.54; 165/44, 80.3, 104.33, 185; 174/16.1–16.3, 547, 548; 257/721–722
See application file for complete search history.

(56) References Cited

U.S. PATENT DOCUMENTS

| 6,031,720 A * | 2/2000 | Crane, Jr. ............ H01L 23/467 361/695 |
| 6,883,592 B2 | 4/2005 | Lee |
| 7,367,385 B1 * | 5/2008 | Materna ................. F28F 1/025 165/146 |
| 2002/0043360 A1 * | 4/2002 | Lee ..................... H01L 23/3677 165/80.3 |
| 2010/0157531 A1 * | 6/2010 | Mason ..................... H01Q 1/02 361/697 |
| 2012/0012294 A1 * | 1/2012 | Miki ..................... B61C 17/00 165/185 |

(Continued)

FOREIGN PATENT DOCUMENTS

| JP | H11-354694 A | 12/1999 |
| JP | 2001-298292 A | 10/2001 |

(Continued)

*Primary Examiner* — Daniel P Wicklund
*Assistant Examiner* — Amir A Jalali
(74) *Attorney, Agent, or Firm* — Manabu Kanesaka

(57) ABSTRACT

In a power converter for a railroad vehicle, adjacent ones of a plurality of fins are spaced apart from each other from a base connected to a base portion to a distal end, and the plurality of fins further spread to both one side and the other side in an alignment direction from the base toward the distal end.

13 Claims, 5 Drawing Sheets

(56) References Cited

U.S. PATENT DOCUMENTS

| | | | | |
|---|---|---|---|---|
| 2013/0306291 A1* | 11/2013 | Tung | ................... | H01L 23/3677 |
| | | | | 165/185 |
| 2013/0312940 A1* | 11/2013 | Huang | ............... | H05K 7/20145 |
| | | | | 165/104.34 |
| 2014/0168895 A1* | 6/2014 | Liu | ..................... | H01L 23/3672 |
| | | | | 361/697 |
| 2016/0106000 A1* | 4/2016 | Tang-Kong | ............. | F28F 3/048 |
| | | | | 165/80.3 |
| 2016/0134177 A1* | 5/2016 | Itoh | ......................... | H02K 9/12 |
| | | | | 105/59 |

FOREIGN PATENT DOCUMENTS

| | | | |
|---|---|---|---|
| JP | 3469475 | B2 | 9/2003 |
| JP | 3847561 | B2 | 9/2006 |
| JP | 3875393 | B2 * | 1/2007 |

* cited by examiner

FIG.5
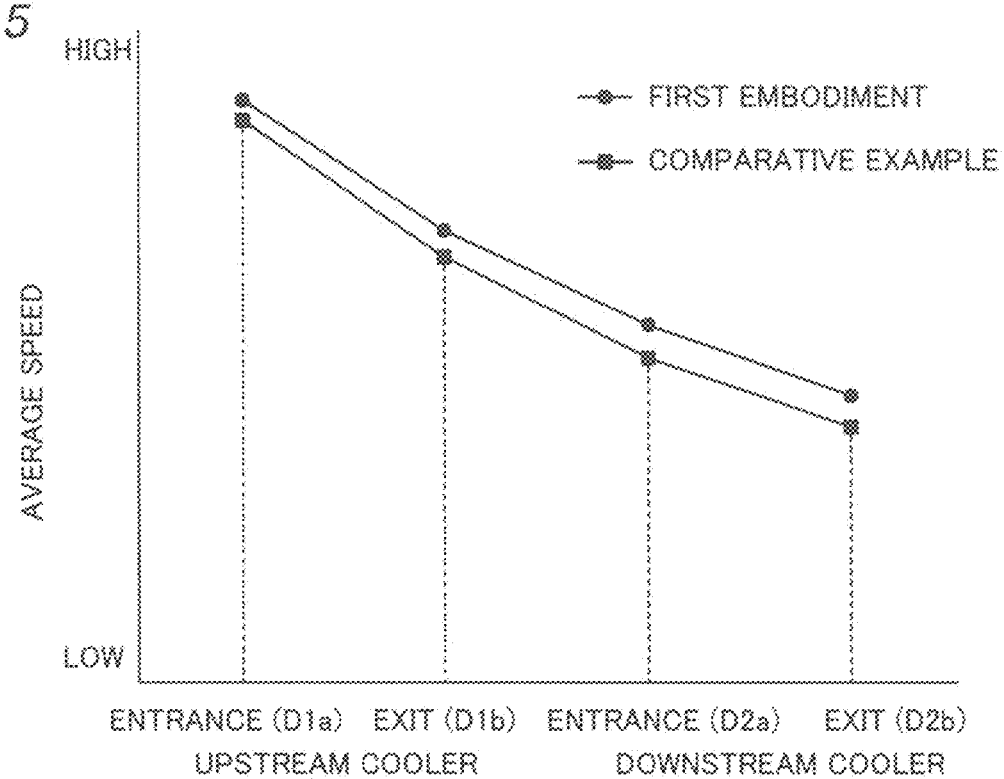
FIG.6 (MODIFICATION)
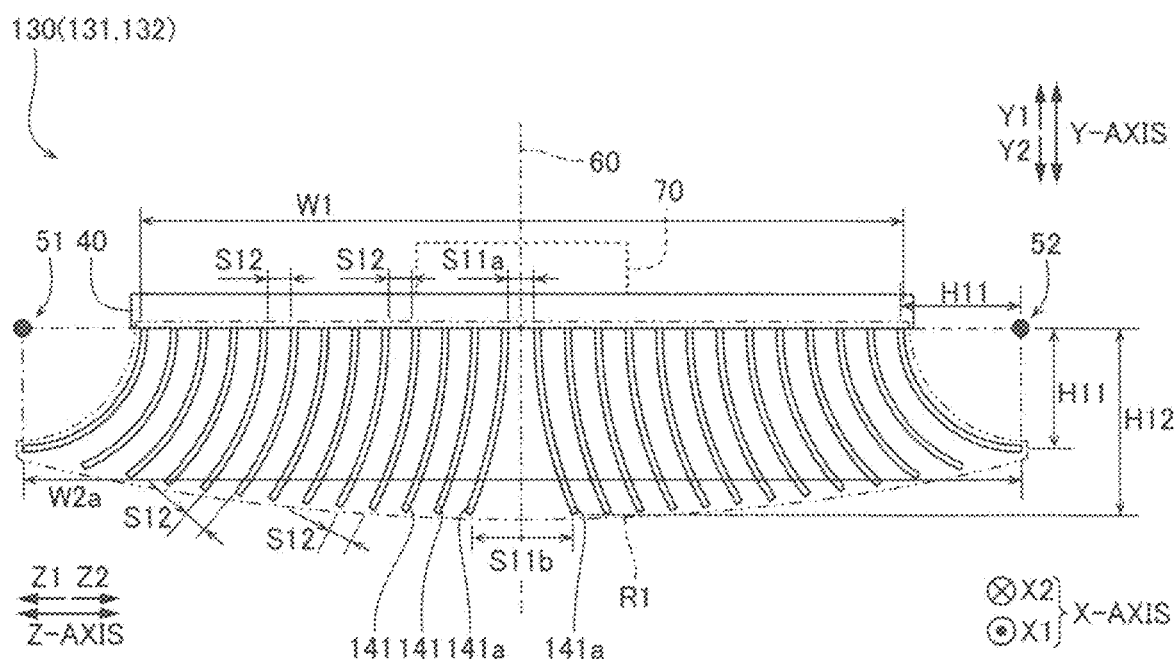

FIG.7 [SECOND EMBODIMENT]
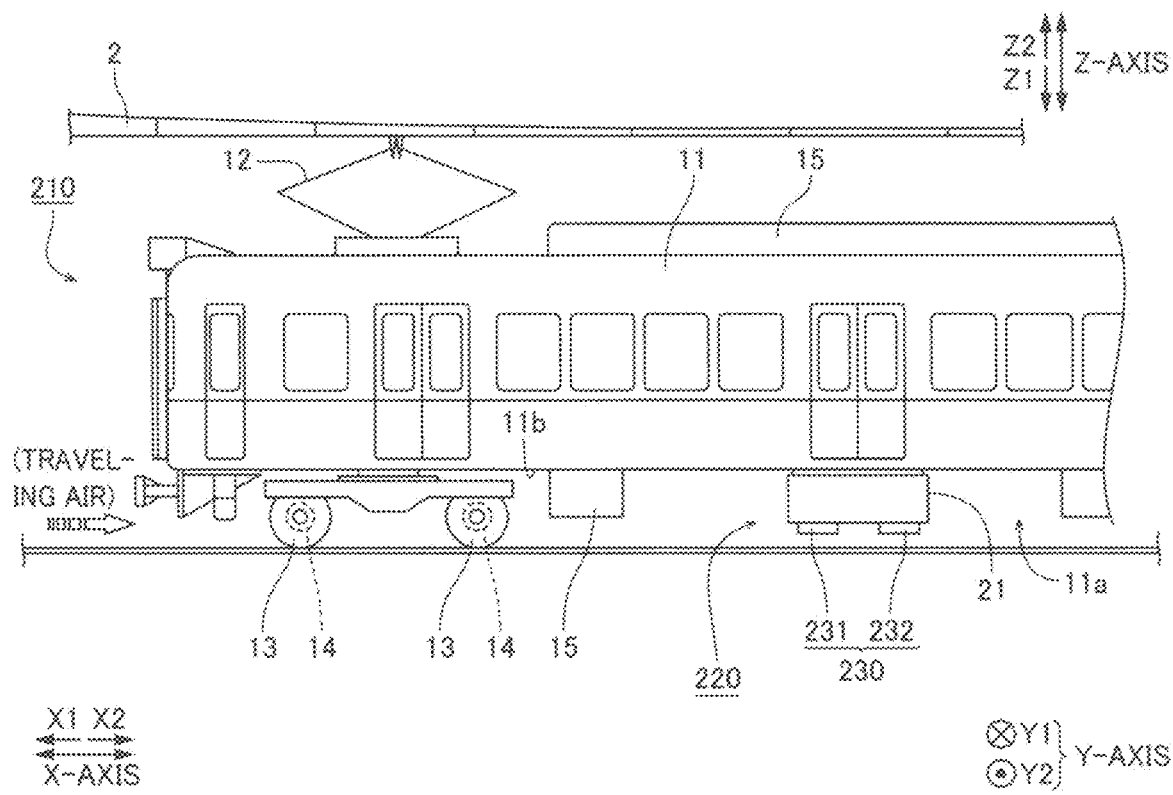
FIG.8
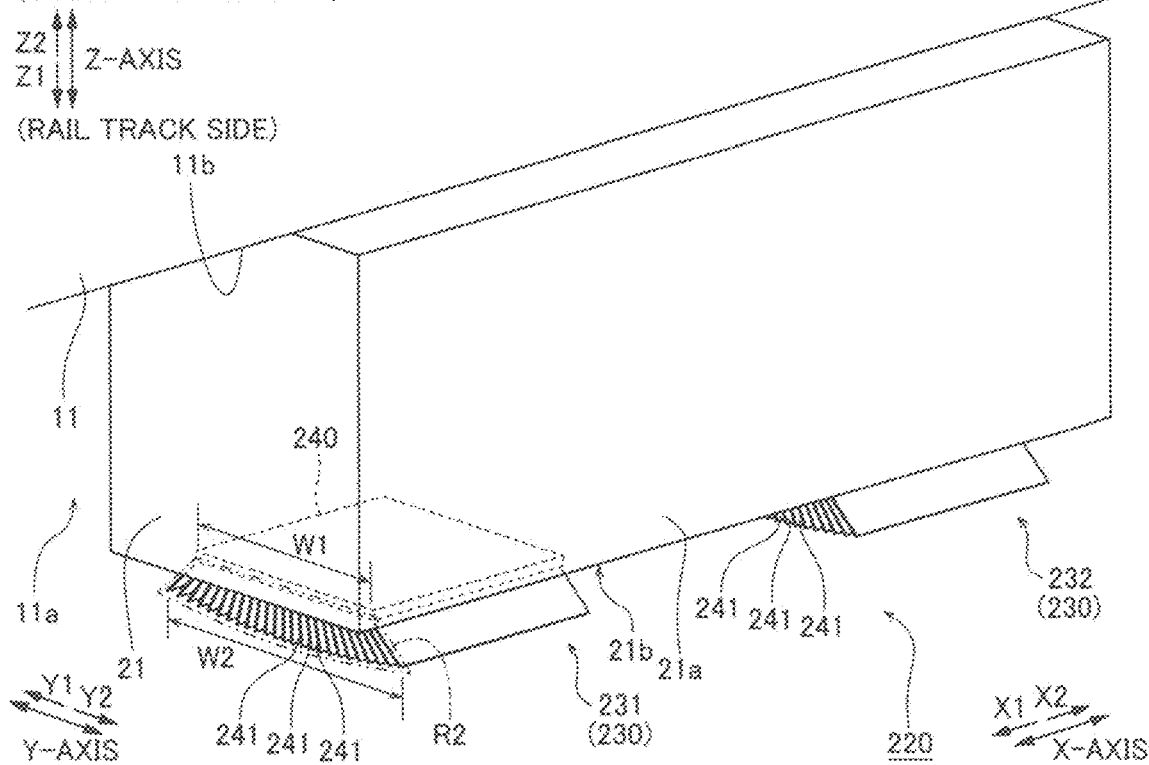

FIG.9 [THIRD EMBODIMENT]
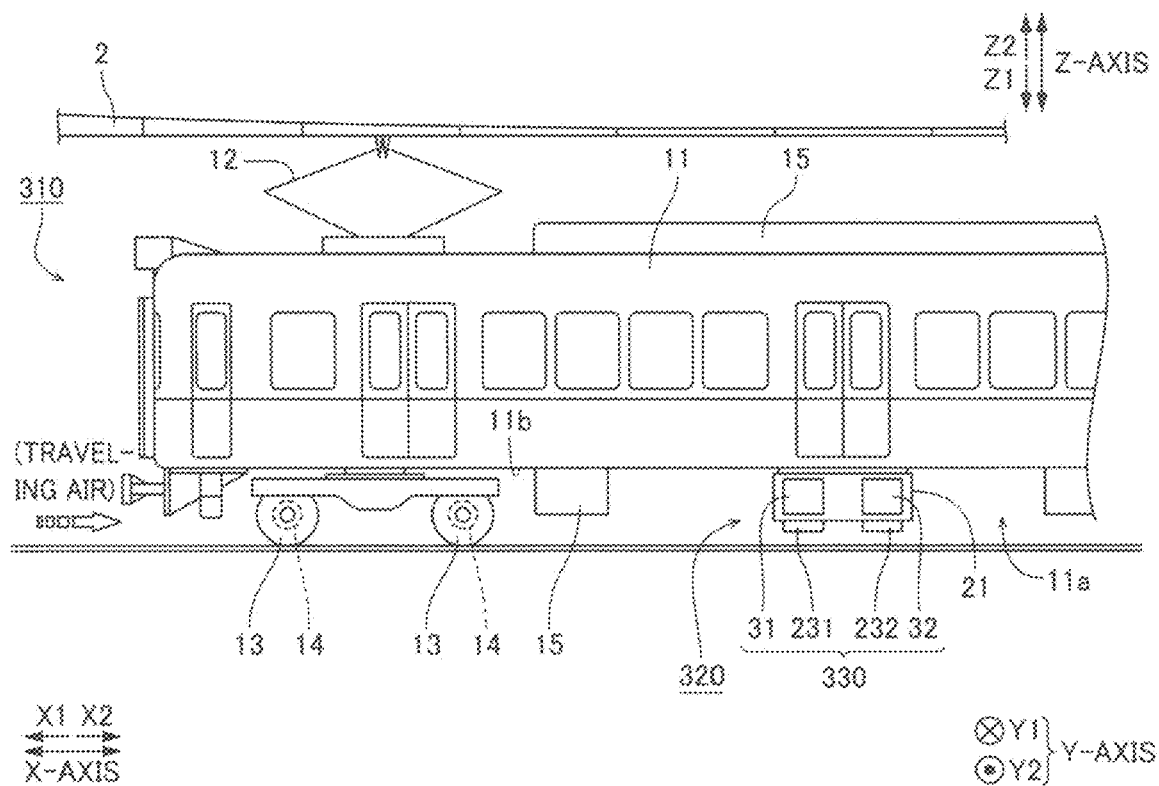
FIG.10
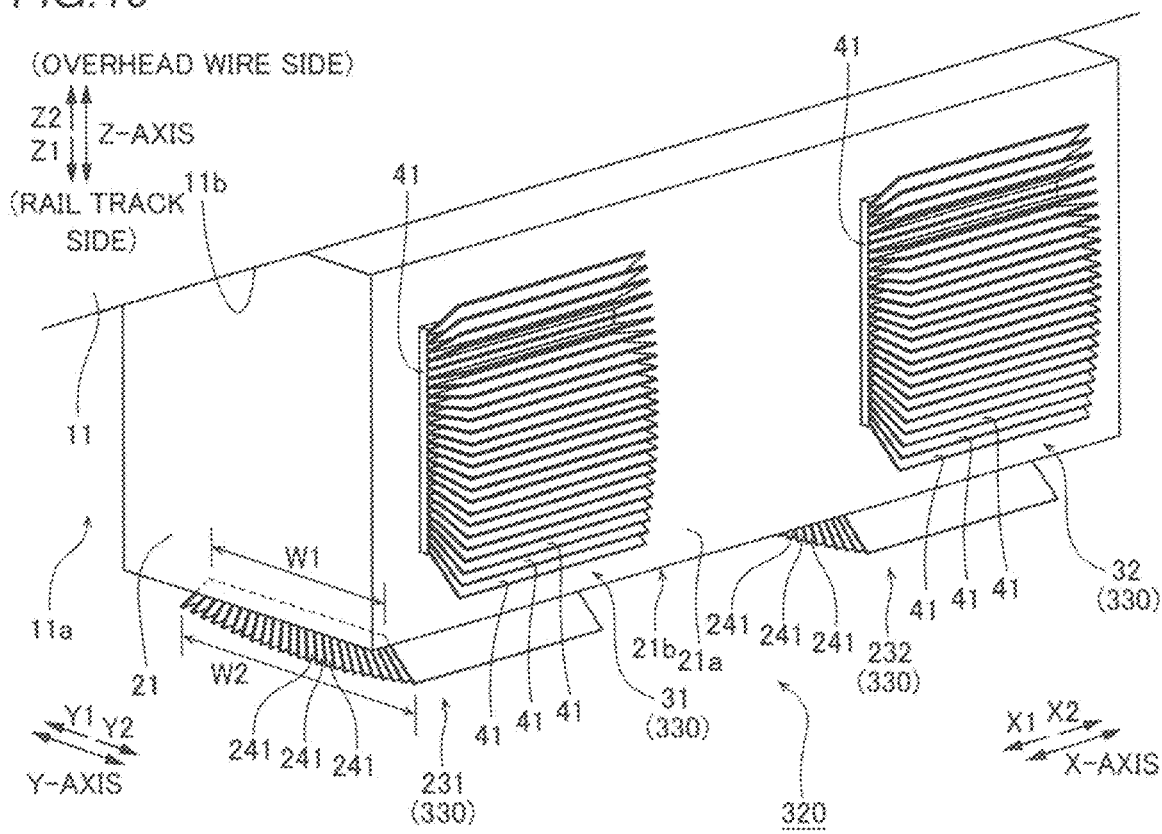

POWER CONVERTER FOR RAILROAD VEHICLE

CROSS-REFERENCE TO RELATED APPLICATION

The priority application number JP2017-085138, Power Converter for Railroad Vehicle, Apr. 24, 2017, Akira Kamiya, Kimihisa Kaneko, and Yoshihisa Uehara, upon which this patent application is based, is hereby incorporated by reference.

BACKGROUND OF THE INVENTION

Field of the Invention

The present invention relates to a power converter for a railroad vehicle, and more particularly, it relates to a power converter for a railroad vehicle mounted on the railroad vehicle and including a cooler that radiates the heat of a power converter body when the railroad vehicle is running.

Description of the Background Art

A power converter for a railroad vehicle mounted on the railroad vehicle and including a cooler that radiates the heat of a power converter body when the railroad vehicle is running is known in general, as disclosed in Japanese Patent No. 3469475, for example.

Japanese Patent No. 3469475 discloses a power converter for a railroad vehicle including a plurality of coolers placed on the lateral side of a power converter body. In the power converter for a railroad vehicle described in Japanese Patent No. 3469475, a plurality of flat plate-shaped fins are disposed parallel to each other at a predetermined interval in an upward-downward direction in each of the plurality of coolers.

However, in the power converter for a railroad vehicle described in Japanese Patent No. 3469475, when traveling air passes between the fins disposed parallel to each other at the predetermined interval, flow path resistance occurs between the fins, and hence the flow speed of the traveling air that passes between the fins decreases.

SUMMARY OF THE INVENTION

The present invention has been proposed in order to solve the aforementioned problem, and an object of the present invention is to provide a power converter for a railroad vehicle capable of significantly reducing or preventing a deterioration in the cooling performance of a cooler due to a decrease in the flow speed of traveling air that passes between fins.

A power converter for a railroad vehicle according to an aspect of the present invention includes a power converter body mounted on the railroad vehicle and a cooler that radiates heat of the power converter body. The cooler includes a base portion having a flat plate shape and a plurality of fins each having a flat plate shape and connected to the base portion so as to protrude from one surface of the base portion opposite to the power converter body, the plurality of fins extend in a running direction of the railroad vehicle, are aligned in an alignment direction so as to be adjacent to each other, and protrude in a protruding direction perpendicular to the running direction and the alignment direction, and adjacent ones of the plurality of fins are spaced apart from each other from a base connected to the base portion to a distal end, and the plurality of fins further spread to both one side and the other side in the alignment direction from the base toward the distal end in the protruding direction.

In the power converter for a railroad vehicle according to this aspect of the present invention, as described above, the adjacent ones of the plurality of fins are spaced apart from each other from the base connected to the base portion to the distal end, and the plurality of fins further spread to both the one side and the other side in the alignment direction from the base toward the distal end in the protruding direction. Thus, the distance between the adjacent fins becomes larger on average in the plurality of fins taken as a whole, as compared with the case where the plurality of fins are disposed parallel to each other so as to be spaced apart from each other from the base to the distal end, and hence the flow path resistance of traveling air between the fins can be decreased. As a result, a decrease in the flow speed of the traveling air is reduced by a decrease in the flow path resistance of the traveling air between the fins, and hence it is possible to significantly reduce or prevent a deterioration in the cooling performance of the cooler due to a decrease in the flow speed of the traveling air that passes between the fins.

In the power converter for a railroad vehicle according to this aspect, a facing distance between the adjacent ones of the plurality of fins in a direction in which the adjacent ones of the plurality of fins face each other preferably gradually increases from the base toward the distal end, or the facing distance is preferably substantially constant from the base to the distal end in a portion of the plurality of fins and the facing distance preferably gradually increases from the base toward the distal end in another portion of the plurality of fins other than the portion in which the facing distance is substantially constant from the base to the distal end. According to this structure, in the portion in which the facing distance gradually increases from the base toward the distal end, the flow path resistance of the traveling air between the fins can be decreased as compared with the case where the facing distance is substantially constant from the base to the distal end. As a result, the flow path resistance of the traveling air between the fins can be reliably decreased as compared with the case where the plurality of fins are disposed parallel to each other so as to be spaced apart from each other from the base to the distal end.

In the structure in which the facing distance gradually increases from the base toward the distal end, or the facing distance gradually increases from the base toward the distal end in another portion of the plurality of fins other than the portion in which the facing distance is substantially constant from the base to the distal end, lengths of the plurality of fins in the protruding direction preferably decrease toward the one side or the other side in the alignment direction. According to this structure, even when the plurality of fins further spread to both the one side and the other side in the alignment direction from the base toward the distal end, the plurality of fins can be made of members having the same length. As a result, it is not necessary to prepare fins having different lengths, and hence a structure for decreasing the flow path resistance of the traveling air between the fins can be easily achieved.

In the structure in which the facing distance gradually increases from the base toward the distal end, or the facing distance gradually increases from the base toward the distal end in another portion of the plurality of fins other than the portion in which the facing distance is substantially constant from the base to the distal end, the plurality of fins are preferably disposed such that the facing distance gradually increases from the base toward the distal end. According to this structure, in all of the fins, the facing distance is a predetermined distance at the base, and is larger than the predetermined distance at portions other than the base, and hence it is possible to reliably reduce the flow path resistance of the traveling air between the fins. As a result, a decrease in the flow speed of the traveling air between the fins can be reliably significantly reduced or prevented.

In the structure in which the facing distance gradually increases from the base toward the distal end, the plurality of fins preferably extend radially about a point located on a side on which the power converter body is provided with respect to the base portion and being opposite to the distal end. According to this structure, the plurality of fins can be easily disposed such that the distance between the adjacent fins is the predetermined distance at the base, and is larger than the predetermined distance at the portions other than the base. As a result, a structure in which the facing distance gradually increases from the base toward the distal end can be easily achieved.

In the structure in which the facing distance gradually increases from the base toward the distal end, or the facing distance gradually increases from the base toward the distal end in another portion of the plurality of fins other than the portion in which the facing distance is substantially constant from the base to the distal end, the facing distance between a pair of fins of the plurality of fins preferably gradually increases from the base toward the distal end, and the facing distance between the plurality of fins on the one side in the alignment direction with respect to the pair of fins and the facing distance between the plurality of fins on the other side in the alignment direction with respect to the pair of fins are preferably constant from the base to the distal end. According to this structure, it is possible to decrease the flow path resistance of the traveling air and significantly reduce or prevent a decrease in the flow speed of the traveling air between the pair of fins between which the facing distance gradually increases from the base toward the distal end. As a result, the pair of fins between which the facing distance gradually increases from the base toward the distal end are disposed at a position of the base portion being close to a heat source of the power converter body and at which the temperature is relatively high, for example, such that the cooler can effectively radiate the heat.

In the structure in which the facing distance between the plurality of fins on the one side in the alignment direction with respect to the pair of fins and the facing distance between the plurality of fins on the other side in the alignment direction with respect to the pair of fins are constant from the base to the distal end, the plurality of fins on the one side preferably further curve to the one side in the alignment direction from the base toward the distal end, and the plurality of fins on the other side preferably further curve to the other side in the alignment direction from the base toward the distal end. According to this structure, the increase rate of the facing distance between the pair of fins between which the facing distance gradually increases from the base toward the distal end can be gradually increased from the base toward the distal end. Therefore, it is possible to further reduce the flow path resistance of the traveling air between the pair of fins between which the facing distance gradually increases from the base toward the distal end.

In the structure in which the plurality of fins on the one side further curve to the one side and the plurality of fins on the other side further curve to the other side, the plurality of fins on the one side are preferably concentrically disposed about a point on the one side in the alignment direction, and the plurality of fins on the other side are preferably concentrically disposed about a point on the other side in the alignment direction. According to this structure, a structure in which the plurality of fins on the one side further curve to the one side in the alignment direction from the base toward the distal end, and the plurality of fins on the other side further curve to the other side in the alignment direction from the base toward the distal end can be easily achieved.

In the power converter for a railroad vehicle according to this aspect, the plurality of fins are preferably disposed substantially symmetrically in the alignment direction with respect to a centerline that passes through a center of a region in which the plurality of fins are provided and extends in the protruding direction, as viewed in the running direction. According to this structure, as compared with the case where the fins are not disposed substantially symmetrically in the alignment direction with respect to the centerline even when the adjacent fins are spaced further apart from the base toward the distal end, it is possible to significantly reduce or prevent large protrusion of the distal end of a fin at one side end or the other side end in the alignment direction to the one side or the other side in the alignment direction with respect to the base. As a result, it is possible to improve the cooling performance of the cooler while significantly reducing or preventing large protrusion of the plurality of fins in the alignment direction.

In the power converter for a railroad vehicle according to this aspect, the cooler is preferably placed in an underfloor space of the railroad vehicle, and the plurality of fins provided in the cooler preferably protrude laterally of the railroad vehicle. According to this structure, when a space for placing the cooler is sufficient on the lateral side of the power converter body, the cooler, in which a deterioration in its cooling performance can be significantly reduced or prevented by significantly reducing or preventing a decrease in the flow speed of the traveling air, can be easily placed. Furthermore, the cooler is provided laterally of the power converter body such that the cooler is exposed to the lateral side of the railroad vehicle when the railroad vehicle is running. Therefore, less turbulent traveling air can be incorporated as compared with the case where the traveling air is incorporated from the lower side of the railroad vehicle on which many other devices etc. are mounted, and hence the traveling air from the lateral side of the railroad vehicle can be easily incorporated by the cooler. As a result, a deterioration in the cooling performance (heat radiation performance) of the cooler can be further significantly reduced or prevented.

In the power converter for a railroad vehicle according to this aspect, the cooler is preferably placed in an underfloor space of the railroad vehicle, and the plurality of fins provided in the cooler preferably protrude downwardly of the railroad vehicle. According to this structure, when a space for placing the cooler is sufficient under the power converter body, the cooler, in which a deterioration in its cooling performance can be significantly reduced or prevented by significantly reducing or preventing a decrease in the flow speed of the traveling air, can be easily placed.

In the power converter for a railroad vehicle according to this aspect, the cooler preferably includes a first cooler and a second cooler disposed at a predetermined interval in the running direction, and each of the first cooler and the second cooler preferably includes the plurality of fins. According to this structure, the traveling air, in which a decrease in its flow speed is significantly reduced or prevented by the upstream one of the first cooler and the second cooler, is incorporated into the downstream one of the first cooler and the second cooler, and a decrease in the flow speed in the downstream cooler is also significantly reduced or prevented, and hence a deterioration in the cooling performance of both the upstream cooler and the downstream cooler can be significantly reduced or prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a graph for comparing the flow speed of the traveling air in the coolers of the power converter according to the first embodiment of the present invention and the flow speed of traveling air in coolers of a power converter according to a conventional example;

FIG. 6 is an enlarged plan view showing one of coolers of a power converter according to a modification of the first embodiment of the present invention;

FIG. 7 is a side elevational view showing a railroad vehicle according to a second embodiment of the present invention;

FIG. 8 is a perspective view showing coolers of a power converter according to the second embodiment of the present invention;

FIG. 9 is a side elevational view showing a railroad vehicle according to a third embodiment of the present invention; and FIG. 10 is a perspective view showing coolers of a power converter according to the third embodiment of the present invention.

DESCRIPTION OF THE PREFERRED EMBODIMENTS

Embodiments of the present invention are hereinafter described with reference to the drawings.

First Embodiment

The structure of a power converter 20 for a railroad vehicle 10 according to a first embodiment of the present invention is now described with reference to FIGS. 1 to 3. The power converter 20 is an example of a "power converter for a railroad vehicle" in the claims. In the following description, the running direction of the railroad vehicle 10 is set as an X-axis direction, the direction of crossties perpendicular to the X-axis direction is set as a Y-axis direction, and an upward-downward direction perpendicular to both the X-axis direction and the Y-axis direction is set as a Z-axis direction.

Figure 1:
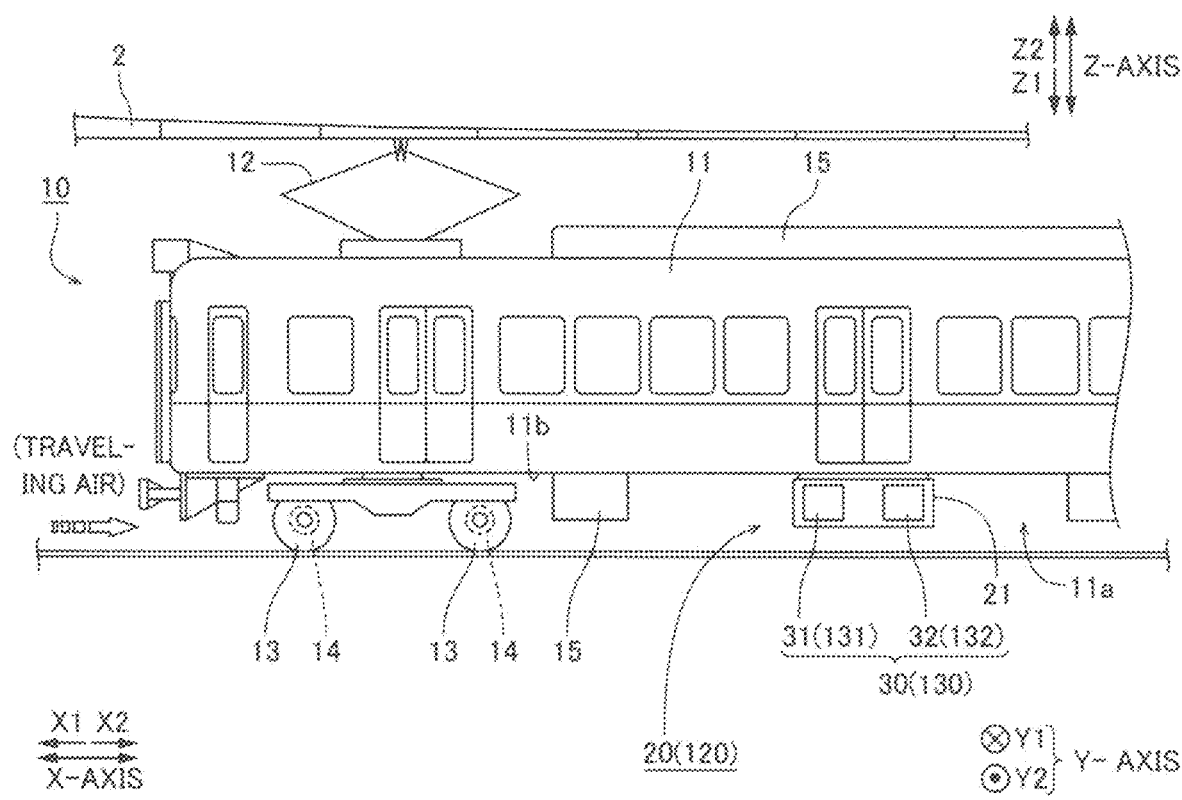
FIG. 1 is a side elevational view showing a railroad vehicle according to a first embodiment of the present invention.
Figure 2:
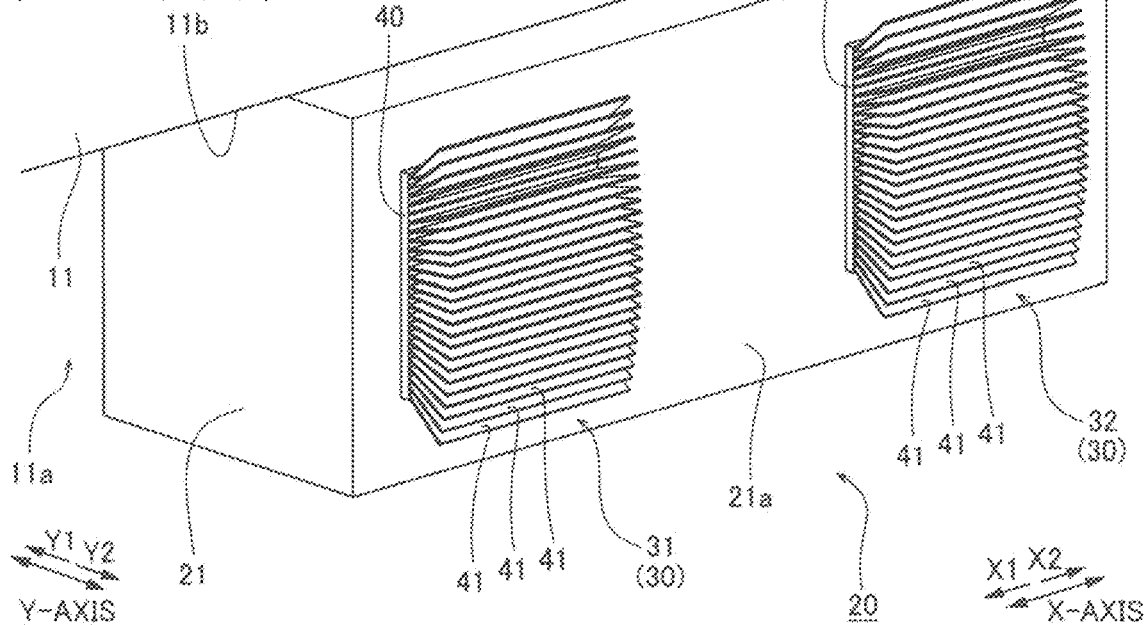
FIG. 2 is a perspective view showing coolers of a power converter according to the first embodiment of the present invention.

The power converter 20 according to the first embodiment of the present invention is placed in an underfloor space 11a of a vehicle body 11 of the railroad vehicle 10, as shown in FIGS. 1 and 2. The schematic structure of the railroad vehicle 10 is now described briefly. The railroad vehicle 10 includes the vehicle body 11, a pantograph 12 that receives (collects) electric power supplied to an overhead wire 2, induction motors 14 (shown by broken lines) that rotate drive wheels 13 using the electric power from the overhead wire 2, and a plurality of other devices 15 such as an air conditioner and a controller, as shown in FIG. 1. The power converter 20 has a function of converting the electric power from the overhead wire 2 by switching of a semiconductor element (not shown) and controlling rotation of the induction motors 14 when the railroad vehicle 10 is running.

(Structure of Power Converter)

The power converter 20 includes a semiconductor device 21 that performs power conversion and a plurality of coolers 30 that radiate heat generated from the semiconductor element in the semiconductor device 21 to outside air. As shown in FIG. 2, the power converter 20 is hung on and fixed to the lower surface 11b of the vehicle body 11 in the underfloor space 11a of the vehicle body 11. In the power converter 20, the plurality of coolers 30 are disposed laterally (in a direction Y2) of the semiconductor device 21. The plurality of coolers 30 include a cooler 31 on an X1 side and a cooler 32 on an X2 side, which are disposed at a predetermined interval in the X-axis direction in which the vehicle body 11 extends. The semiconductor device 21 is an example of a "power converter body" in the claims. The coolers 30 are examples of a "cooler" in the claims. The cooler 31 and the cooler 32 are examples of a "first cooler" and a "second cooler" in the claims, respectively.

(Structure of Cooler)

Each of the cooler 31 and the cooler 32 includes a heat receiving plate 40 provided on the side surface 21a of the semiconductor device 21 on a Y2 side and a plurality of fins 41 connected to the lateral side (Y2 side) of the heat receiving plate 40. The heat receiving plate 40 is an example of a "base portion" in the claims.

The heat receiving plate 40 has a flat plate shape that extends in the X-axis direction and the Y-axis direction. The heat receiving plate 40 transfers the heat generated from the semiconductor element inside the semiconductor device 21 to the plurality of fins 41.

As shown in FIG. 2, the plurality of fins 41 extend in a thin plate shape along the X-axis direction, and are aligned adjacent to each other in the Z-axis direction. In addition, the plurality of fins 41 protrude in the direction Y2 from one surface (Y2 side) of the heat receiving plate 40. In the following description, the Z-axis direction and the Y-axis direction may be referred to as an "alignment direction" and a "protruding direction", respectively, in some cases.

Figure 3:
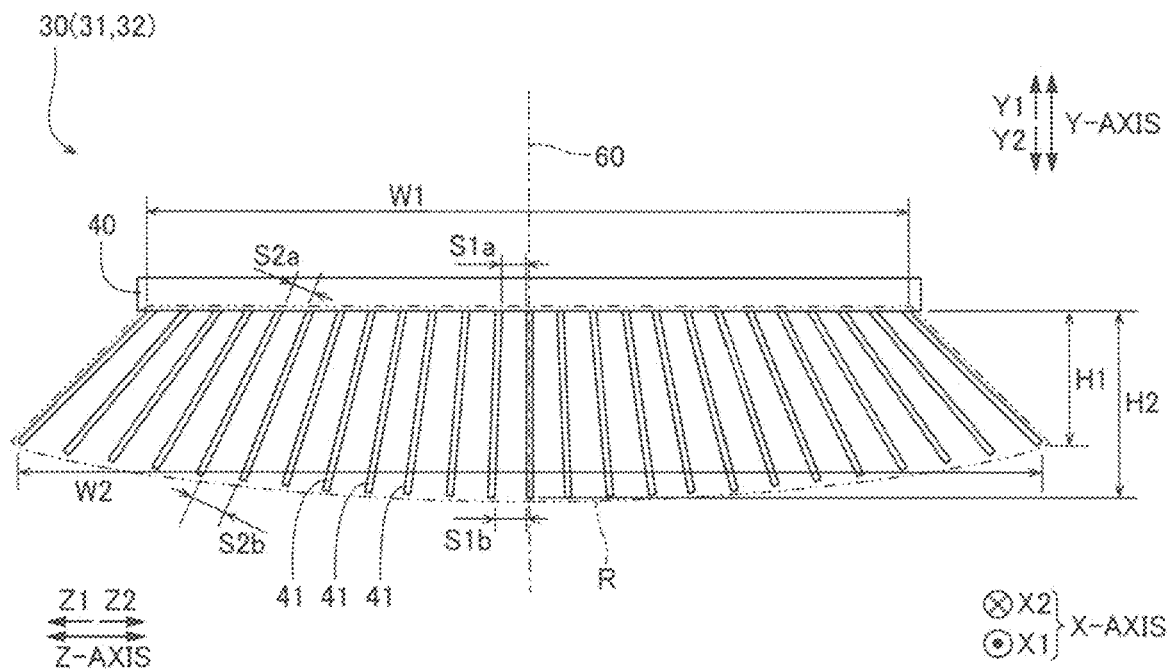
FIG. 3 is an enlarged plan view showing one of the coolers of the power converter according to the first embodiment of the present invention.

As shown in FIG. 3, the plurality of fins 41 are more inclined with respect to the protruding direction (Y-axis direction) toward one side (Z1 side) and the other side (Z2 side) in the alignment direction (Z-axis direction). Thus, the lengths W of a base (Y1 side) and a distal end (Y2 side) of a region R, in which the plurality of fins 41 are provided, in the alignment direction are a length W1 and a length W2 (longer than the length W1), respectively. In other words, the plurality of fins 41 further spread to both the one side and the other side in the alignment direction from the base toward the distal end.

The plurality of fins 41 are disposed symmetrically in the alignment direction (Z-axis direction) with respect to a centerline 60 that passes through the center of the region R in which the plurality of fins 41 are provided and extends in the protruding direction (Y-axis direction), as viewed in the running direction (X-axis direction).

The plurality of fins 41 according to the first embodiment are made of flat plates having substantially the same shape. In other words, the plurality of fins 41 each are made of a plate material having a length in a longitudinal direction and a length in a short-side direction equal to each other and a uniform thickness. The plurality of fins 41 each are connected to one surface (Y2 side) of the heat receiving plate 40 at a predetermined angle. As described above, the plurality of fins 41 are more inclined with respect to the protruding direction (Y-axis direction) toward the one side (Z1 side) and the other side (Z2 side) in the alignment direction (Z-axis direction). Thus, the lengths H of the plurality of fins 41 in the protruding direction gradually decrease from the length H2 of a fin 41 in the vicinity of the centerline 60 to the lengths H1 of fins 41 on the one side and the other side in the alignment direction.

According to the first embodiment, adjacent ones of the plurality of fins 41 are spaced apart from each other from the base (Y1 side) to the distal end (Y2 side). Furthermore, a facing distance S between the fins 41 adjacent to each other in a facing direction gradually increases from the base toward the distal end. The "facing distance S" indicates a length that connects the adjacent fins 41 to each other on a line perpendicular to a centerline between the fins 41 adjacent to each other.

For example, as shown in FIG. 3, the facing distance S in the alignment direction (Z-axis direction) in the vicinity of the centerline 60 is a facing distance S1a at the base and a facing distance S1b (larger than the facing distance S1a) at the distal end. Furthermore, the facing distance S in the alignment direction (Z-axis direction) on the one side (Z1 side) is a facing distance S2a at the base and a facing distance S2b (larger than the facing distance S2a) at the distal end. According to the first embodiment, the plurality of fins 41 are disposed such that all the facing distances S at the base are substantially equal to each other (the facing distance S1a and the facing distance S2a are substantially equal to each other).

With the structure described above, according to the first embodiment, the facing distances S at the base are equal to each other, and the facing distances S at portions including the distal end other than the base are larger than the facing distances S at the base. Therefore, as compared with the case where the plurality of fins are disposed parallel to each other with the same facing distance S, the distance between the adjacent fins 41 becomes larger on average in the entire region R in which the plurality of fins 41 are provided (in the plurality of fins 41 taken as a whole), and hence flow path resistance that occurs when traveling air passes between the fins 41 can be decreased.

(Example)

Results of calculation of the flow speed of the traveling air and the cooling performance of the coolers by thermal fluid analysis when the railroad vehicle 10 is running in a direction X1 in the power converter 20 according to the first embodiment are now described.

Figure 4:
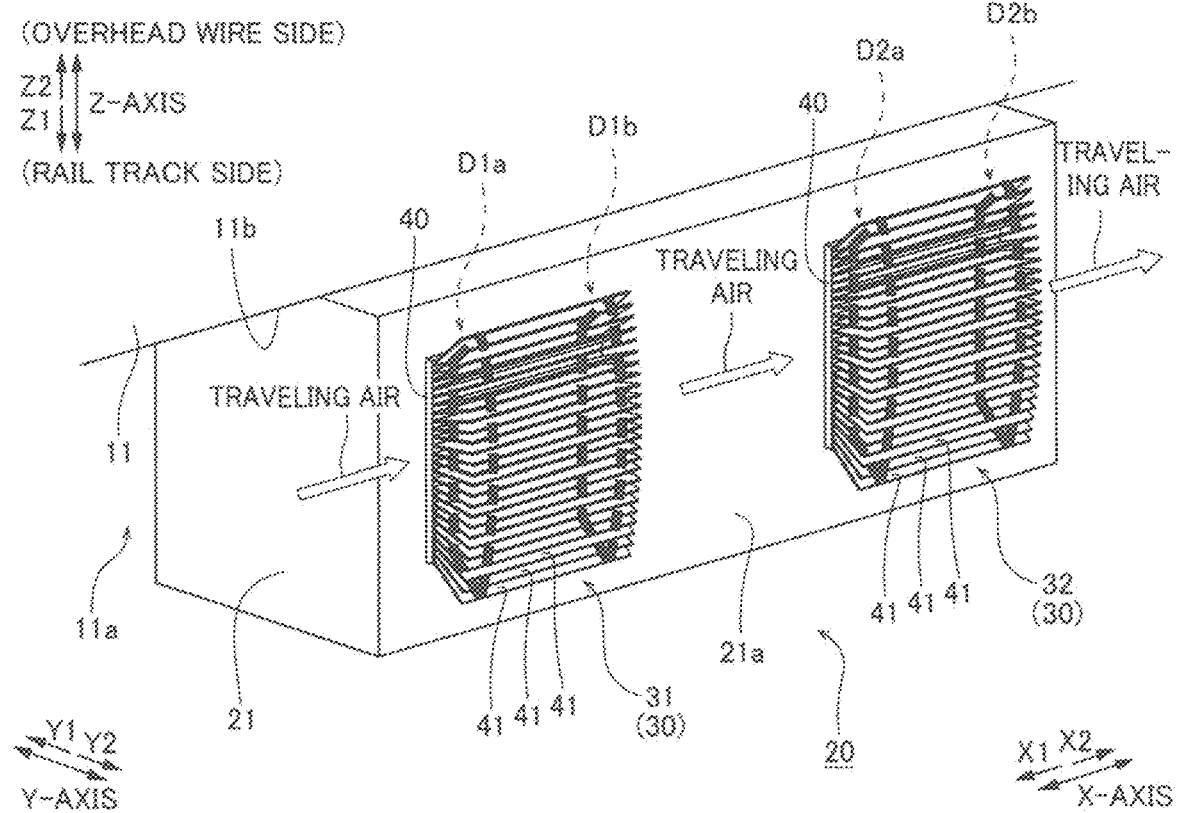
FIG. 4 illustrates measurement of the flow speed of traveling air in the coolers of the power converter according to the first embodiment of the present invention.

As shown in FIG. 4, the flow speed of the traveling air was calculated on the cross-section D1a, the cross-section D1b, the cross-section D2a, and the cross-section D2b of the coolers 30 in a YZ plane. The cross-section D1a and the cross-section D1b are cross-sections of the cooler 31 in the vicinity of ends of the fins 41 on the X1 side and the X2 side, respectively, and the cross-sections D2a and the cross-section D2b are cross-sections of the cooler 32 in the vicinity of ends of the fins 41 on the X1 side and the X2 side, respectively. That is, the average speed (a value obtained by dividing a volume flow rate on each cross-section by its cross-sectional area) of the traveling air was calculated in the vicinity of an entrance and the vicinity of an exit of the cooler 31 on the upstream side of the traveling air and in the vicinity of an entrance and the vicinity of an exit of the cooler 32 on the downstream side of the traveling air. The flow speed of the traveling air in the case where the fins 41 all having the same shape were disposed parallel to each other in the alignment direction (Z-axis direction) was also calculated as a comparative example.

FIG. 5 shows the average speed of the traveling air on the cross-section D1a, the cross-section D1b, the cross-section D2a, and the cross-section D2b. On any of the cross-section D1a, the cross-section D1b, the cross-section D2a, and the cross-section D2b, the average speed of the traveling air between the fins 41 in the power converter 20 according to the first embodiment was larger than the average speed of the traveling air between the fins 41 according to the comparative example in which the fins 41 all having the same shape were disposed parallel to each other in the alignment direction. This is conceivably because in the power converter 20 according to the first embodiment, the facing distance S between the adjacent fins 41 increased from the base toward the distal end of the fins 41, and hence the flow path resistance between the fins 41 decreased such that a decrease in the speed of the traveling air was significantly reduced or prevented. When the semiconductor device 21 was generating heat, the heat radiation performance of the coolers 30 was measured, and it has been confirmed that the temperature rise of the semiconductor device 21 can be decreased by about 5% as compared with the comparative example.

(Effects of First Embodiment)

According to the first embodiment, the following effects can be obtained.

In the power converter 20 according to the first embodiment, the adjacent ones of the plurality of fins 41 are spaced apart from each other from the base (Y1 side) connected to the heat receiving plate 40 to the distal end (Y2 side), and the plurality of fins 41 further spread to both the one side (Z1 side) and the other side (Z2 side) in the alignment direction (Z-axis direction) from the base toward the distal end in the protruding direction (Y-axis direction). Thus, the distance between the adjacent fins 41 becomes larger on average in the plurality of fins 41 taken as a whole, as compared with the case where the plurality of fins 41 are disposed parallel to each other so as to be spaced apart from each other from the base to the distal end, and hence the flow path resistance of the traveling air between the fins 41 can be decreased. As a result, a decrease in the flow speed of the traveling air is reduced by a decrease in the flow path resistance of the traveling air between the fins 41, and hence it is possible to significantly reduce or prevent a deterioration in the cooling performance of the coolers 30 due to a decrease in the flow speed of the traveling air that passes between the fins 41.

In the power converter 20 according to the first embodiment, as described above, the facing distance S between the adjacent ones of the plurality of fins 41 in the facing direction gradually increases from the base (Y1 side) toward the distal end (Y2 side). Thus, in a portion in which the facing distance S gradually increases from the base toward the distal end, the flow path resistance of the traveling air between the fins 41 can be decreased as compared with the case where the facing distance S is substantially constant from the base to the distal end. Furthermore, in all of the fins 41, the facing distance S is the predetermined distance S1a (S2a) at the base, and is larger than the predetermined distance S1a (S2a) at portions other than the base, and hence it is possible to reliably reduce the flow path resistance of the traveling air between the fins 41. As a result, a decrease in the flow speed of the traveling air between the fins 41 can be reliably significantly reduced or prevented as compared with the case where the plurality of fins 41 are disposed parallel to each other so as to be spaced apart from each other from the base to the distal end.

In the power converter 20 according to the first embodiment, as described above, the lengths H of the plurality of fins 41 in the protruding direction (Y-axis direction) decrease toward the one side (Z1 side) or the other side (Z2 side) in the alignment direction (Z-axis direction). Thus, even when the plurality of fins 41 further spread to both the one side and the other side in the alignment direction from the base (Y1 side) toward the distal end (Y2 side), the plurality of fins 41 can be made of members having the same length. As a result, it is not necessary to prepare fins 41 having different lengths, and hence a structure for decreasing the flow path resistance of the traveling air between the fins 41 can be easily achieved.

In the power converter 20 according to the first embodiment, as described above, the plurality of fins 41 are disposed symmetrically in the alignment direction (Z-axis direction) with respect to the centerline 60 that passes through the center of the region R in which the plurality of fins 41 are provided and extends in the protruding direction (Y-axis direction), as viewed in the running direction (X-axis direction). Thus, as compared with the case where the fins 41 are not disposed substantially symmetrically in the alignment direction with respect to the centerline 60 while the adjacent fins 41 are spaced further apart from the base (Y1 side) toward the distal end (Y2 side), it is possible to significantly reduce or prevent large protrusion of the distal end of a fin 41 at one side (Z1 side) end or the other side (Z2 side) end in the alignment direction to the one side or the other side in the alignment direction with respect to the base. As a result, it is possible to improve the cooling performance of the coolers 30 while significantly reducing or preventing large protrusion of the plurality of fins 41 in the alignment direction.

In the power converter 20 according to the first embodiment, as described above, the coolers 30 are placed in the underfloor space 11a of the railroad vehicle 10, and the plurality of fins 41 provided in the coolers 30 protrude laterally (in the direction Y2) of the railroad vehicle 10. Thus, when a space for placing the coolers 30 is sufficient on the lateral side of the semiconductor device 21, the coolers 30, in which a deterioration in their cooling performance can be significantly reduced or prevented by significantly reducing or preventing a decrease in the flow speed of the traveling air, can be easily placed. Furthermore, the coolers 30 are provided laterally of the semiconductor device 21 such that the coolers 30 are exposed to the lateral side of the railroad vehicle 10 when the railroad vehicle 10 is running. Therefore, less turbulent traveling air can be incorporated as compared with the case where the traveling air is incorporated from the lower side of the railroad vehicle 10 on which many other devices etc. are mounted, and hence the traveling air from the lateral side of the railroad vehicle 10 can be easily incorporated by the coolers 30. As a result, a deterioration in the cooling performance (heat radiation performance) of the coolers 30 can be further significantly reduced or prevented.

In the power converter 20 according to the first embodiment, as described above, the coolers 30 include the cooler 31 and the cooler 32 disposed at the predetermined interval in the running direction (X-axis direction), and each of the cooler 31 and the cooler 32 includes the plurality of fins 41. Thus, the traveling air, in which a decrease in its flow speed is significantly reduced or prevented by the upstream one of the cooler 31 and the cooler 32, is incorporated into the downstream one of the cooler 31 and the cooler 32, and a decrease in the flow speed in the downstream cooler 30 is also significantly reduced or prevented, and hence a deterioration in the cooling performance of both the upstream cooler 30 and the downstream cooler 30 can be significantly reduced or prevented.

(Modification of First Embodiment)

A modification of the first embodiment is now described with reference to FIGS. 1 and 6. According to this modification of the first embodiment, fins 141 each having a shape different from the shape of each of the fins 41 according to the first embodiment are provided. In the figures, the same structures as those of the first embodiment are denoted by the same reference numerals.

As shown in FIG. 1, in a power converter 120 according to this modification of the first embodiment, a plurality of coolers 130 are disposed laterally (in a direction Y2) of a semiconductor device 21. The plurality of coolers 130 include a cooler 131 on an X1 side and a cooler 132 on an X2 side, which are disposed at a predetermined interval in an X-axis direction. The coolers 130 are examples of a "cooler" in the claims. The cooler 131 and the cooler 132 are examples of a "first cooler" and a "second cooler" in the claims, respectively.

As shown in FIG. 6, each of the cooler 131 and the cooler 132 includes a heat receiving plate 40 and a plurality of fins 141 provided laterally (Y2 side) of the heat receiving plate 40.

The lengths W of a base (Y1 side) and a distal end (Y2 side) of a region R1, in which the plurality of fins 141 are provided, in an alignment direction (Z-axis direction) are a length W1 and a length W2a (longer than the length W1), respectively. In other words, similarly to the fins 41 according to the first embodiment, the plurality of fins 141 further spread to both one side (Z1 side) and the other side (Z2 side) in the alignment direction from the base toward the distal end.

Of the plurality of fins 141, fins 141 on the one side (Z1 side) in the alignment direction (Z-axis direction) with respect to a centerline 60 are concentrically disposed about a point 51 on the Z1 side with respect to the heat receiving plate 40 and in the vicinity of the heat receiving plate 40 in a protruding direction (Y-axis direction). That is, the fins 141 on the Z1 side with respect to the centerline 60 further curve to the Z1 side from the base (Y1 side) toward the distal end (Y2 side). Furthermore, fins 141 on the other side (Z2 side) with respect to the centerline 60 in the alignment direction are concentrically disposed about a point 52 on the Z2 side with respect to the heat receiving plate 40 and in the vicinity of the heat receiving plate 40 in the protruding direction. That is, the fins 141 on the Z2 side with respect to the centerline 60 further curve to the Z2 side from the base toward the distal end. Each of the plurality of fins 141 is made by performing predetermined bending on a flat plate having substantially the same shape as the plurality of fins 41 according to the first embodiment. Thus, the lengths H of the plurality of fins 141 in the protruding direction gradually decrease from the length H12 of fins 141 in the vicinity of the centerline 60 to the length H11 of fins 141 on the one side and the other side in the alignment direction.

A facing distance S between a pair of fins 141*a*, which sandwich the centerline 60 therebetween, of the plurality of fins 141 is a facing distance S11*a* at the base (Y1 side) and a facing distance S11*b* (larger than the facing distance S11*a*) at the distal end (Y2 side). That is, the facing distance S between the pair of fins 141*a* of the plurality of fins 141 gradually increases from the base toward the distal end. A facing distance S between adjacent fins 141 other than the pair of fins 141*a* of the plurality of fins 141 is a facing distance S12 at the base and a facing distance S12 at the distal end, and is constant from the base to the distal end.

With the structure described above, according to this modification of the first embodiment, the facing distance S between the pair of fins 141*a* at portions including the distal end (Y2 side) other than the base (Y1 side) is larger than the facing distance S therebetween at the base (Y1 side), and the facing distance S between the fins 141 other than the pair of fins 141*a* is substantially constant from the base to the distal end. Therefore, as compared with the case where a plurality of fins are disposed parallel to each other with the same facing distance S, the distance between the adjacent fins 141 becomes larger on average in the entire region R1 in which the plurality of fins 141 are provided (in the plurality of fins 141 taken as a whole), and hence flow path resistance that occurs when traveling air passes between the fins 141 can be decreased.

In the power converter 120 according to this modification of the first embodiment, a heat source (such as a semiconductor element) 70 in the semiconductor device 21 is disposed so as to contact a central portion of the heat receiving plate 40 in the alignment direction (Z-axis direction). Therefore, the center portion of the heat receiving plate 40 in the alignment direction (Z-axis direction) is close to the heat source 70, and hence the temperature is relatively high at the center portion of the heat receiving plate 40 in the alignment direction (Z-axis direction). Therefore, the facing distance S between the pair of fins 141*a*, which are connected to the vicinity of the center portion of the heat receiving plate 40 in the alignment direction, of the plurality of fins 141 gradually increases from the base (Y1 side) toward the distal end (Y2 side), and hence heat generated from the heat source 70 can be effectively radiated.

The remaining structures of this modification of the first embodiment are similar to those of the first embodiment.

(Effects of Modification of First Embodiment)

According to this modification of the first embodiment, the following effects can be obtained.

In the power converter 120 according to this modification of the first embodiment, as described above, the facing distance S between adjacent ones of the plurality of fins 141 in a direction in which the adjacent fins 141 face each other is substantially constant from the base (Y1 side) to the distal end (Y2 side) in a portion of the plurality of fins 141, and the facing distance S gradually increases from the base toward the distal end in another portion of the plurality of fins 141 other than the portion in which the facing distance S is substantially constant from the base to the distal end. Thus, in the portion in which the facing distance S gradually increases from the base toward the distal end, the flow path resistance of the traveling air between the fins 141 can be decreased as compared with the case where the facing distance S is substantially constant from the base to the distal end. As a result, the flow path resistance of the traveling air between the fins 141 can be reliably decreased as compared with the case where the plurality of fins 141 are disposed parallel to each other so as to be spaced apart from each other from the base to the distal end.

In the power converter 120 according to this modification of the first embodiment, as described above, the facing distance S between the pair of fins 141*a* of the plurality of fins 141 gradually increases from the base (Y1 side) toward the distal end (Y2 side), and the facing distance S between the plurality of fins 141 on the one side (Z1 side) in the alignment direction (Z-axis direction) with respect to the pair of fins 141*a* and the facing distance S between the plurality of fins 141 on the other side (Z2 side) in the alignment direction (Z-axis direction) with respect to the pair of fins 141*a* are substantially constant from the base to the distal end. Thus, it is possible to decrease the flow path resistance of the traveling air and significantly reduce or prevent a decrease in the flow speed of the traveling air between the pair of fins 141*a* between which the facing distance S gradually increases from the base toward the distal end. As a result, the pair of fins 141*a* between which the facing distance S gradually increases from the base toward the distal end are disposed at a position of the heat receiving plate 40 being close to the heat source of the semiconductor device 21 and at which the temperature is relatively high, for example, such that the coolers 130 can effectively radiate the heat.

In the power converter 120 according to this modification of the first embodiment, as described above, the plurality of fins 141 on the one side (Z1 side) further curve to the one side in the alignment direction (X-axis direction) from the base (Y1 side) toward the distal end (Y2 side), and the plurality of fins 141 on the other side (Z2 side) further curve to the other side in the alignment direction from the base toward the distal end. Thus, the increase rate of the facing distance S between the pair of fins 141*a* between which the facing distance S gradually increases from the base toward the distal end can be gradually increased from the base toward the distal end. Therefore, it is possible to further reduce the flow path resistance of the traveling air between the pair of fins 141*a* between which the facing distance S gradually increases from the base toward the distal end.

In the power converter 120 according to this modification of the first embodiment, as described above, the plurality of fins 141 on the one side (Z1 side) are concentrically disposed about the point 51 on the one side in the alignment direction (Z-axis direction), and the plurality of fins 141 on the other side (Z2 side) are concentrically disposed about the point 52 on the other side in the alignment direction. Thus, a structure in which the plurality of fins 141 on the one side further curve to the one side in the alignment direction from the base (Y1 side) toward the distal end (Y2 side), and the plurality of fins 141 on the other side further curve to the other side in the alignment direction from the base toward the distal end can be easily achieved.

The remaining effects of this modification of the first embodiment are similar to those of the first embodiment.

Second Embodiment

A second embodiment is now described with reference to FIGS. 7 and 8. According to this second embodiment, coolers 230 having the same structure as that of the coolers 30 according to the first embodiment and that protrude downwardly of a semiconductor device 21 are provided. In the figures, the same structures as those of the first embodiment are denoted by the same reference numerals.

As shown in FIGS. 7 and 8, a power converter 220 for a railroad vehicle 210 according to the second embodiment of the present invention includes the semiconductor device 21 and a plurality of coolers 230. As shown in FIG. 7, in the power converter 220, the plurality of coolers 230 are disposed downwardly (in a direction Z1) of the semiconductor device 21. The plurality of coolers 230 include a cooler 231 on an X1 side and a cooler 232 on an X2 side, which are disposed at a predetermined interval in an X-axis direction. The power converter 220 is an example of a "power converter for a railroad vehicle" in the claims. The coolers 230 are examples of a "cooler" in the claims. The cooler 231 and the cooler 232 are examples of a "first cooler" and a "second cooler" in the claims, respectively.

As shown in FIG. 8, each of the cooler 231 and the cooler 232 includes a heat receiving plate 240 provided on the lower surface 21b of the semiconductor device 21 on a Z1 side and a plurality of fins 241 connected to the lower side (Z1 side) of the heat receiving plate 240. The heat receiving plate 240 is an example of a "base portion" in the claims.

The plurality of fins 241 extend in a thin plate shape along the X-axis direction, and are aligned adjacent to each other in a Y-axis direction. In addition, the plurality of fins 241 protrude in the direction Z1 from one surface (Z1 side) of the heat receiving plate 240. In the following description, the Y-axis direction and a Z-axis direction may be referred to as an "alignment direction" and a "protruding direction", respectively, in some cases.

The plurality of fins 241 are more inclined with respect to the protruding direction (Z-axis direction) toward one side (Y1 side) and the other side (Y2 side) in the alignment direction (Y-axis direction). Thus, the lengths W of a base (Z2 side) and a distal end (Z1 side) of a region R2, in which the plurality of fins 241 are provided, in the alignment direction are a length W1 and a length W2 (longer than the length W1), respectively. In other words, the plurality of fins 241 further spread to both the one side and the other side in the alignment direction from the base (Z2 side) toward the distal end (Z1 side).

Similarly to the first embodiment, adjacent ones of the plurality of fins 241 are spaced apart from each other from the base (Z2 side) to the distal end (Z1 side).

With the structure described above, in the power converter 220 according to the second embodiment, a distance between the adjacent fins 241 becomes large on average in the entire region R2 in which the plurality of fins 241 are provided (in the plurality of fins 241 taken as a whole) similarly to the power converter 20 according to the first embodiment. Thus, flow path resistance that occurs when traveling air passes between the fins 241 can be decreased.

The structure of the power converter 220 according to the second embodiment is obtained by replacing the coolers 30 provided laterally of the semiconductor device 21 in the power converter 20 according to the first embodiment by the coolers 230 provided downwardly of the semiconductor device 21. Therefore, the remaining structures of the power converter 220 according to the second embodiment are the same as those of the power converter 20 according to the first embodiment except that the Y-axis direction (protrusion direction) and the Z-axis direction (alignment direction) of the power converter 20 according to the first embodiment are referred to as the Z-axis direction and the Y-axis direction, respectively.

(Effects of Second Embodiment)

According to the second embodiment, the following effects can be obtained.

In the power converter 220 according to the second embodiment, as described above, the region in which the plurality of fins 241 are provided further spreads to both the one side (Y1 side) and the other side (Y2 side) in the alignment direction (Y-axis direction) from the base (Z2 side) connected to the heat receiving plate 240 toward the distal end (Z1 side) opposite to the heat receiving plate 240 in the protruding direction (Z-axis direction) being perpendicular to a running direction (X-axis direction) and the alignment direction (Y-axis direction) and in which the plurality of fins 241 protrude. Furthermore, the adjacent ones of the plurality of fins 241 are spaced apart from each other from the base connected to the heat receiving plate 240 to the distal end. Thus, similar to the power converter 20 according to the first embodiment, the flow path resistance of the traveling air between the fins 241 can be decreased. As a result, by a decrease in the flow path resistance of the traveling air between the fins 241, a decrease in the flow speed of the traveling air can be reduced, and a deterioration in the cooling performance of the coolers 230 can be reduced.

In the power converter 220 according to the second embodiment, as described above, the coolers 230 are placed in an underfloor space 11a of the railroad vehicle 210, and the plurality of fins 241 provided in the coolers 230 protrude downwardly (in the direction Z1) of the railroad vehicle 210. Thus, when a space for placing the coolers 230 is sufficient under a semiconductor device 21, the coolers 230, the cooling performance of which can be improved by significantly reducing or preventing a decrease in the flow speed of the traveling air, can be easily placed.

The remaining effects of the second embodiment are similar to those of the first embodiment.

Third Embodiment

A third embodiment is now described with reference to FIGS. 9 and 10. According to the third embodiment, coolers 330 having both the same structure as the coolers 30 according to the first embodiment and the same structure as the coolers 230 according to the second embodiment are provided. In the figures, the same structures as those of the first embodiment and the second embodiment are denoted by the same reference numerals.

As shown in FIGS. 9 and 10, a power converter 320 for a railroad vehicle 310 according to a third embodiment of the present invention includes a semiconductor device 21 and a plurality of coolers 330. As shown in FIG. 9, in the power converter 320, the plurality of coolers 330 are disposed laterally (in a direction Y2) and downwardly (in a direction Z1) of the semiconductor device 21. The plurality of coolers 330 include a cooler 31 on an X1 side and a cooler 32 on an X2 side which are disposed at a predetermined interval in an X-axis direction laterally of the semiconductor device 21, and a cooler 231 on the X1 side and a cooler 232 on the X2 side which are disposed at a predetermined interval in the X-axis direction downwardly of the semiconductor device 21. The power converter 320 is an example of a "power converter for a railroad vehicle" in the claims. The coolers 330 are examples of a "cooler" in the claims.

The structure of the power converter 320 according to the third embodiment is obtained by providing the coolers 30 provided laterally of the semiconductor device 21 in the power converter 20 according to the first embodiment and the coolers 230 provided downwardly of the semiconductor device 21 in the power converter 220 according to the second embodiment as the coolers 330 laterally and downwardly of the semiconductor device 21, respectively. Therefore, the structure of the power converter 320 according to the third embodiment combines the structure of the power converter 20 according to the first embodiment and the structure of the power converter 220 according to the second embodiment.

Therefore, the effects of the power converter 320 according to the third embodiment combine the effects of the power converter 20 according to the first embodiment and the effects of the power converter 220 according to the second embodiment. In other words, the cooling performance of the coolers 330 can be improved by reducing a decrease in the flow speed of traveling air by decreases in the flow path resistance of the traveling air between fins 41 and between fins 241. As a result, as compared with the structure of the power converter 20 according to the first embodiment in which the coolers are provided only laterally of the semiconductor device 21 and the structure of the power converter 220 according to the second embodiment in which the coolers are provided only downwardly of the semiconductor device 21, the cooling performance of the coolers 330 can be further improved.

[Other Modifications]

The embodiments and modification disclosed this time must be considered as illustrative in all points and not restrictive. The range of the present invention is shown not by the above description of the embodiments and modification but by the scope of claims for patent, and all modifications within the meaning and range equivalent to the scope of claims for patent are further included.

For example, while the plurality of fins 41 (241) are disposed such that all the facing distances S at the base are substantially equal to each other in each of the power converters 20, 220, and 320 according to the aforementioned first to third embodiments, the present invention is not restricted to this. In the plurality of fins 41 (241), the facing distances S at the base may alternatively be different from each other. In this case, the plurality of fins 41 (241) may extend radially from a point located on the side on which the semiconductor device 21 is provided with respect to the heat receiving plate 40 (240) and being opposite to the distal end. When the plurality of fins 41 (241) extend radially from a single point in this manner, the plurality of fins 41 (241) can be easily disposed such that the facing distance S between the adjacent fins 41 (241) gradually increases from the base to the distal end.

While the plurality of fins 41 (241) are disposed such that all of the facing distances S between the adjacent fins 41 (241) gradually increase from the base to the distal end in each of the power converters 20, 220, and 320 according to the aforementioned first to third embodiments, the present invention is not restricted to this. The plurality of fins 41 (241) may alternatively be disposed such that some of the facing distances S between the adjacent fins 41 (241) are constant from the base to the distal end, and others of the facing distances S between the adjacent fins 41 (241) gradually increase from the base to the distal end. In addition, the plurality of fins 41 (241) may alternatively be disposed such that some of the facing distances S between the adjacent fins 41 (241) gradually decrease from the base to the distal end.

While the plurality of fins 141 on the one side (Z1 side) and the other side (Z2 side) in the alignment direction (Z-axis direction) with respect to the pair of fins 141*a* are disposed such that the facing distances S between the adjacent fins 141 are constant from the base to the distal end in the power converter 120 according to the aforementioned modification of the first embodiment, the present invention is not restricted to this. All of the plurality of fins 141 may alternatively be disposed such that the facing distances S between the adjacent fins 141 gradually increase from the base to the distal end, similarly to the first embodiment.

In addition, the structure of the plurality of fins 141 of the power converter 120 according to the modification of the first embodiment, which are concentrically disposed, may alternatively be applied to the plurality of fins 241 of the power converter 220 according to the second embodiment. Furthermore, in the third embodiment that combines the structure of the first embodiment and the structure of the second embodiment, the plurality of fins of the coolers 330 provided laterally (Y2 side) and downwardly (Z1 side) of the power converter 320 may alternatively be concentrically disposed.

While the plurality of fins 41 (241) are made of flat plates having substantially the same shape in each of the power converters 20, 220, and 320 according to the aforementioned first to third embodiments, the present invention is not restricted to this. The plurality of fins 41 (241) may alternatively have lengths different from each other.

While the plurality of fins 141 are made by performing the predetermined bending on the flat plates having substantially the same shape in the power converter 120 according to the aforementioned modification of the first embodiment, the present invention is not restricted to this. The plurality of fins 141 may alternatively be made by performing the predetermined bending on flat plates having shapes different from each other.

While the lengths H of the plurality of fins 41 (141, 241) in the protruding direction in which the plurality of fins 41 (141, 241) protrude gradually decrease from the vicinity of the centerline 60 toward the one side and the other side in the alignment direction in each of the power converters 20, 120, 220, and 320 according to the aforementioned first to third embodiments and the aforementioned modification of the first embodiment, the present invention is not restricted to this. The lengths H of the plurality of fins 41 (141, 241) in the protruding direction in which the plurality of fins 41 (141, 241) protrude may alternatively gradually increase from the vicinity of the centerline 60 toward the one side and the other side in the alignment direction, or may alternatively be equal to each other. In addition, the lengths H of the plurality of fins 41 (141, 241) in the protruding direction may alternatively be non-uniform.

While the plurality of fins 41 (141, 241) are disposed symmetrically in the alignment direction with respect to the centerline 60 that passes through the center of the region in which the plurality of fins 41 (141, 241) are provided and extends in the protruding direction, as viewed in the running direction in each of the power converters 20, 120, 220, and 320 according to the aforementioned first to third embodiments and the aforementioned modification of the first embodiment, the present invention is not restricted to this. The plurality of fins 41 (141, 241) may alternatively be disposed asymmetrically in the alignment direction with respect to the centerline 60 that passes through the center of the region in which the plurality of fins 41 (141, 241) are provided and extends in the protruding direction, as viewed in the running direction.

While the cooler 31 (131) and the cooler 32 (132) are provided on the side surface of the semiconductor device 21 on the one side (Y2 side) in each of the power converters 20, 120, and 320 according to the aforementioned first and third embodiments and the aforementioned modification of the first embodiment, the present invention is not restricted to this. The cooler 31 (131) and the cooler 32 (132) may alternatively be provided on the side surface of the semiconductor device 21 on the other side (Y1 side). Furthermore, the cooler 31 (131) and the cooler 32 (132) may alternatively be provided on the side surfaces of the semiconductor device 21 on both sides.

While the two coolers are aligned at the predetermined interval in the running direction in each of the power converters 20, 120, 220, and 320 according to the aforementioned first to third embodiments and the aforementioned modification of the first embodiment, the present invention is not restricted to this. Only one cooler may alternatively be provided in the running direction, or three or more coolers may alternatively be provided at predetermined intervals in the running direction.

While the present invention is applied to the power converter 20, 120, 220, or 320 placed in the underfloor space 11a of the vehicle body 11 in each of the aforementioned first to third embodiments and the aforementioned modification of the first embodiment, the present invention is not restricted to this. The present invention may alternatively be applied to a power converter placed on the roof of the vehicle body 11, for example.

While the present invention is applied to the power converter 20, 220, or 320 of the catenary railroad vehicle 10, 210, or 310 that runs using electric power from the overhead wire 2 in each of the aforementioned first to third embodiments and the aforementioned modification of the first embodiment, the present invention is not restricted to this. The present invention may alternatively be applied to a power converter of a third rail type railroad vehicle 10, 210, or 310 that collects electric power by scraping a collector shoe provided on a vehicle body 11 against a third rail for power feeding (third rail) separately laid along a rail for running.

While the present invention is applied to the power converter 20, 220, or 320 of the catenary railroad vehicle 10, 210, or 310 that runs using electric power from the overhead wire 2 in each of the aforementioned first to third embodiments and the aforementioned modification of the first embodiment, the present invention is not restricted to this. More specifically, the present invention may alternatively be applied to cool a device mounted on a diesel railcar that uses a diesel engine as a direct drive source or cool a power converter of a railroad vehicle 10, 210, or 310 such as an electric diesel railcar that rotates induction motors 14 by power generation of a diesel engine.

What is claimed is:

1. A power converter for a railroad vehicle, comprising:
   a power converter body mounted on the railroad vehicle; and
   a cooler that radiates heat of the power converter body,
   wherein the cooler includes a base portion having a flat plate shape and a plurality of fin-plates each having a plate shape and connected to the base portion so as to protrude from one surface of the base portion opposite to the power converter body,
   the plurality of fin-plates extends in a running direction of the railroad vehicle, is aligned in an alignment direction so as to be adjacent to each other, and protrudes in a protruding direction perpendicular to the running direction and the alignment direction,
   adjacent ones of the plurality of fin-plates are spaced apart from each other from a base connected to the base portion to a distal end, and the plurality of fin-plates further spreads to both one side and the other side in the alignment direction from the base toward the distal end in the protruding direction,
   the plurality of fin-plates is disposed such that a distance between the bases of adjacent fin-plates connected to the base portion is larger than a thickness of each of the plurality of fin-plates and further a distance between the distal ends of the adjacent fin-plates gradually increases from a center of the base portion toward the one side and from the center toward the other side in the alignment direction, and
   the plurality of fin-plates is spaced apart from each other at equal intervals at the bases connected to the base portion, and a facing distance between the adjacent ones of the plurality of fin-plates in a direction in which the adjacent ones of the plurality of fin-plates face each other gradually increases from the base toward the distal end.

2. The power converter for a railroad vehicle according to claim 1, wherein lengths of the plurality of fin-plates in the protruding direction decrease toward the one side or the other side in the alignment direction.

3. The power converter for a railroad vehicle according to claim 1, wherein the plurality of fin-plates extends radially about a point located on a side on which the power converter body is provided with respect to the base portion and being opposite to the distal end.

4. The power converter for a railroad vehicle according to claim 1, wherein the plurality of fin-plates is disposed symmetrically in the alignment direction with respect to a centerline that passes through a center of a region in which the plurality of fin-plates is provided and extends in the protruding direction, as viewed in the running direction.

5. The power converter for a railroad vehicle according to claim 1, wherein the cooler is placed in an underfloor space of the railroad vehicle, and the plurality of fin-plates provided in the cooler protrudes laterally of the railroad vehicle.

6. The power converter for a railroad vehicle according to claim 1, wherein the cooler is placed in an underfloor space of the railroad vehicle, and the plurality of fin-plates provided in the cooler protrudes downwardly of the railroad vehicle.

7. The power converter for a railroad vehicle according to claim 1, wherein the cooler includes a first cooler and a second cooler disposed at a predetermined interval in the running direction, and each of the first cooler and the second cooler includes the plurality of fin-plates.

8. A power converter for a railroad vehicle, comprising:
   a power converter body mounted on the railroad vehicle; and
   a cooler that radiates heat of the power converter body,
   wherein the cooler includes a base portion having a flat plate shape and a plurality of fin-plates each having a plate shape and connected to the base portion so as to protrude from one surface of the base portion opposite to the power converter body,
   the plurality of fin-plates extends in a running direction of the railroad vehicle, is aligned in an alignment direction so as to be adjacent to each other, and protrudes in a protruding direction perpendicular to the running direction and the alignment direction,
   adjacent ones of the plurality of fin-plates are spaced apart from each other from a base connected to the base portion to a distal end, and the plurality of fin-plates further spreads to both one side and the other side in the alignment direction from the base toward the distal end in the protruding direction,
   the plurality of fin-plates is disposed such that a distance between the distal ends of the adjacent fin-plates gradually increases from a center of the base portion toward the one side and from the center toward the other side in the alignment direction, and a facing distance between the adjacent ones of the plurality of fin-plates in a direction in which the adjacent ones of the plurality of fin-plates face each other is constant from the base to the distal end in a portion of the plurality of fin-plates and the facing distance gradually increases from the base toward the distal end in another portion of the plurality of fin-plates other than the portion of the plurality of fin-plates in which the facing distance is constant from the base to the distal end.

9. The power converter for a railroad vehicle according to claim 8, wherein the facing distance between a pair of fin-plates of the plurality of fin-plates gradually increases from the base toward the distal end, and the facing distance between the plurality of fin-plates on the one side in the alignment direction with respect to the pair of fin-plates and the facing distance between the plurality of fin-plates on the other side in the alignment direction with respect to the pair of fin-plates are constant from the base to the distal end.

10. The power converter for a railroad vehicle according to claim 9, wherein the plurality of fin-plates on the one side further curves to the one side in the alignment direction from the base toward the distal end, and the plurality of fin-plates on the other side further curves to the other side in the alignment direction from the base toward the distal end.

11. The power converter for a railroad vehicle according to claim 10, wherein the plurality of fin-plates on the one side is concentrically disposed about a point on the one side in the alignment direction, and the plurality of fin-plates on the other side is concentrically disposed about a point on the other side in the alignment direction.

12. The power converter for a railroad vehicle according to claim 8, wherein the plurality of fin-plates on the one side curves to the one side from the base radially about a point located on a side for a predetermined distance away from the base, and the plurality of fin-plates on another side curves to another side from the base radially about another point located on a side opposite to the one point for a predetermined distance away from the base.

13. A power converter for a railroad vehicle, comprising:
a power converter body mounted on the railroad vehicle; and
a cooler that radiates heat of the power converter body,
wherein the cooler includes a base portion having a flat plate shape and a plurality of fin-plates each having a plate shape and connected to the base portion so as to protrude from one surface of the base portion opposite to the power converter body,
the plurality of fin-plates extends in a running direction of the railroad vehicle, is aligned in an alignment direction so as to be adjacent to each other, and protrudes in a protruding direction perpendicular to the running direction and the alignment direction,
adjacent ones of the plurality of fin-plates are spaced apart from each other from a base connected to the base portion to a distal end, and the plurality of fin-plates further spreads to both one side and the other side in the alignment direction from the base toward the distal end in the protruding direction,
the plurality of fin-plates is disposed such that a distance between the bases of adjacent fin-plates connected to the base portion is larger than a thickness of a fin-plate and further a distance between distal ends of the adjacent fin-plates gradually increases from a center of the base portion toward the one side and from the center toward the other side in the alignment direction, and
a facing distance between the adjacent ones of the plurality of fin-plates in a direction in which the adjacent ones of the plurality of fin-plates face each other is constant from the base to the distal end in a portion of the plurality of fin-plates and the facing distance gradually increases from the base toward the distal end in another portion of the plurality of fin-plates other than the portion of the plurality of fin-plates in which the facing distance is constant from the base to the distal end.

* * * * *